United States Patent
Nation et al.

(10) Patent No.: US 12,277,477 B2
(45) Date of Patent: Apr. 15, 2025

(54) QUANTUM CIRCUIT OPTIMIZATION ROUTINE EVALUATION AND KNOWLEDGE BASE GENERATION

(71) Applicant: International Business Machines Corporation, Armonk, NY (US)

(72) Inventors: Paul Nation, Yorktown Heights, NY (US); Ali Javadiabhari, Sleepy Hollow, NY (US); Francisco Jose Martin Fernandez, Chappaqua, NY (US); Ismael Faro Sertage, Chappaqua, NY (US); Jay Michael Gambetta, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1000 days.

(21) Appl. No.: 17/121,146

(22) Filed: Dec. 14, 2020

(65) Prior Publication Data

US 2022/0188680 A1 Jun. 16, 2022

(51) Int. Cl.
*G06N 10/00* (2022.01)
*G06F 8/41* (2018.01)
(Continued)

(52) U.S. Cl.
CPC .............. *G06N 10/00* (2019.01); *G06F 8/41* (2013.01); *G06F 11/3433* (2013.01); *G06F 30/337* (2020.01)

(58) Field of Classification Search
CPC .......... G06N 10/00; G06N 5/02; G06N 10/20; G06N 10/80; G06N 20/10; G06N 5/022;
(Continued)

(56) References Cited

U.S. PATENT DOCUMENTS 10,592,216 B1 * 3/2020 Richardson ......... G06F 11/3452
10,650,178 B2 5/2020 Mosca et al.
(Continued)

FOREIGN PATENT DOCUMENTS

| CN | 107977541 | 5/2018 |
| CN | 108334952 | 7/2018 |
| WO | 201977240 | 4/2019 |

OTHER PUBLICATIONS

Alam et al., "Circuit Compilation Methodologies for Quantum Approximate Optimization Algorithm" (Year: 2020).*
(Continued)

*Primary Examiner* — Alan Chen
(74) *Attorney, Agent, or Firm* — Amin, Turocy & Watson, LLP

(57) ABSTRACT

Systems, computer-implemented methods, and computer program products to facilitate evaluation of quantum circuit optimization routines and knowledge base generation are provided. According to an embodiment, a system can comprise a processor that executes computer executable components stored in memory. The computer executable components can comprise a compilation component that concurrently executes different quantum circuit optimization sequences on multiple copies of a quantum circuit. The computer executable components can further comprise an identification component that identifies at least one of the different quantum circuit optimization sequences that generates an output quantum circuit comprising defined criteria.

25 Claims, 10 Drawing Sheets

(51) Int. Cl.
*G06F 11/34* (2006.01)
*G06F 30/337* (2020.01)

(58) Field of Classification Search
CPC .. G06N 5/00; G06N 20/00; G06F 8/41; G06F 11/3433; G06F 30/337; G06F 8/443; G06F 8/00; G06F 8/40; G06F 8/42; G06F 11/00; G06F 11/3409; G06F 11/34; G06F 11/30; G06F 30/32; G06F 30/30; G06F 30/00; G06F 30/3447; G06F 8/4432; G06F 8/44

See application file for complete search history.

(56) References Cited

U.S. PATENT DOCUMENTS

| | | |
|---|---|---|
| 10,706,365 B2 | 7/2020 | Nation |
| 2006/0123363 A1 | 6/2006 | Williams et al. |
| 2018/0260732 A1* | 9/2018 | Bloom ................ G06N 10/40 |
| 2019/0121921 A1 | 4/2019 | Nam et al. |
| 2020/0074035 A1 | 3/2020 | Javadiabhari et al. |
| 2020/0184023 A1 | 6/2020 | Delaney et al. |

OTHER PUBLICATIONS

Zhang et al., "An efficient quantum circuits optimizing scheme compared with QISKit" (Year: 2018).*

McCaskey et al., "Hybrid Programming for Near-term Quantum Computing Systems" (Year: 2018).*

Fosel et al., "Reinforcement Learning with Neural Networks for Quantum Feedback" (Year: 2018).*

Mell et al., "The NIST Definition of Cloud Computing," Recommendations of the National Institute of Standards and Technology, NIST Special Publication 800-145, Sep. 2011, 7 pages.

* cited by examiner

QUANTUM CIRCUIT OPTIMIZATION ROUTINE EVALUATION AND KNOWLEDGE BASE GENERATION

BACKGROUND

The subject disclosure relates to quantum circuit optimization routines, and more specifically, to evaluation of quantum circuit optimization routines and knowledge base generation.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, computer-implemented methods, and/or computer program products that can facilitate evaluation of quantum circuit optimization routines and knowledge base generation are described.

According to an embodiment, a system can comprise a processor that executes computer executable components stored in memory. The computer executable components can comprise a compilation component that concurrently executes different quantum circuit optimization sequences on multiple copies of a quantum circuit. The computer executable components can further comprise an identification component that identifies at least one of the different quantum circuit optimization sequences that generates an output quantum circuit comprising defined criteria.

According to another embodiment, a computer-implemented method can comprise executing, by a system operatively coupled to a processor, concurrently, different quantum circuit optimization sequences on multiple copies of a quantum circuit. The computer-implemented method can further comprise identifying, by the system, at least one of the different quantum circuit optimization sequences that generates an output quantum circuit comprising defined criteria.

According to another embodiment, a computer program product comprising a computer readable storage medium having program instructions embodied therewith, the program instructions executable by a processor to cause the processor to execute, concurrently, different quantum circuit optimization sequences on multiple copies of a quantum circuit. The program instructions are further executable by the processor to cause the processor to identify at least one of the different quantum circuit optimization sequences that generates an output quantum circuit comprising defined criteria.

According to another embodiment, a system can comprise a processor that executes computer executable components stored in memory. The computer executable components can comprise a knowledge base component that generates a knowledge base comprising multiple output quantum circuits generated from concurrent execution of different quantum circuit optimization sequences on multiple copies of a quantum circuit. The computer executable components can further comprise a recommendation component that employs a trained model to recommend at least one of the different quantum circuit optimization sequences to generate an output quantum circuit comprising defined criteria.

According to another embodiment, a computer-implemented method can comprise generating, by a system operatively coupled to a processor, a knowledge base comprising multiple output quantum circuits generated from concurrent execution of different quantum circuit optimization sequences on multiple copies of a quantum circuit. The computer-implemented method can further comprise employing, by the system, a trained model to recommend at least one of the different quantum circuit optimization sequences to generate an output quantum circuit comprising defined criteria.

DETAILED DESCRIPTION

Figure 1:
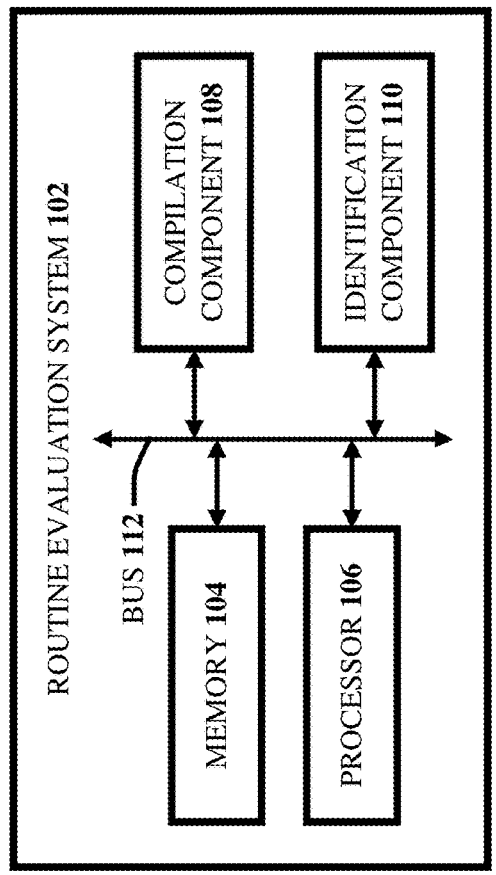
FIGS. 1, 2, 3, 4, and 5 illustrate block diagrams of example, non-limiting systems that can each facilitate evaluation of quantum circuit optimization routines and knowledge base generation in accordance with one or more embodiments described herein.
Figure 2:
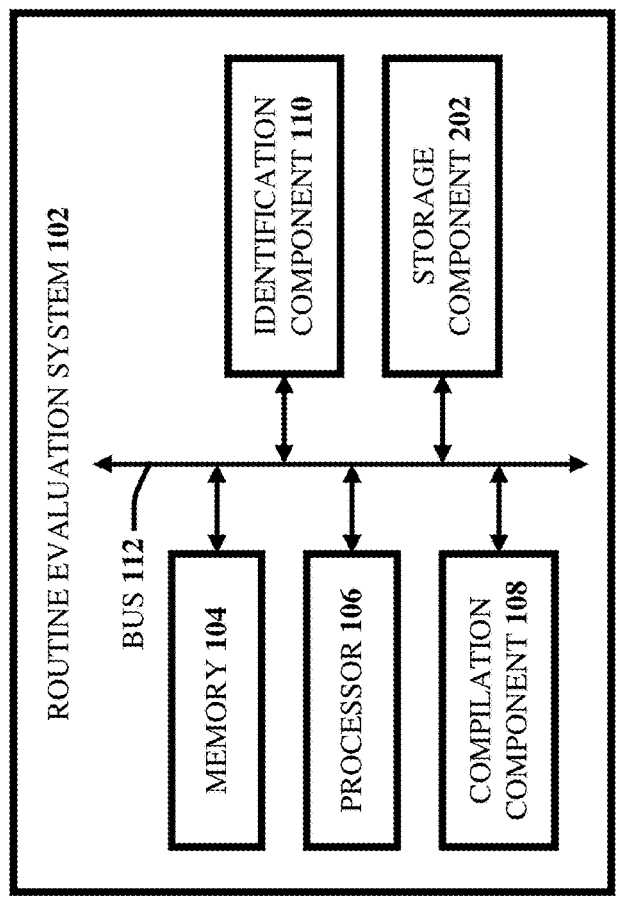
Figure 3:
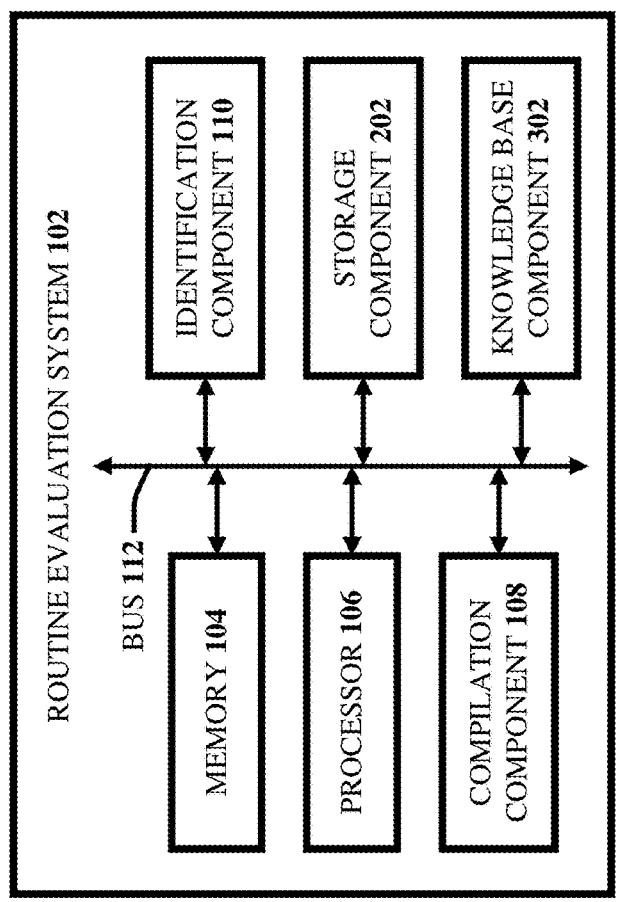
Figure 4:
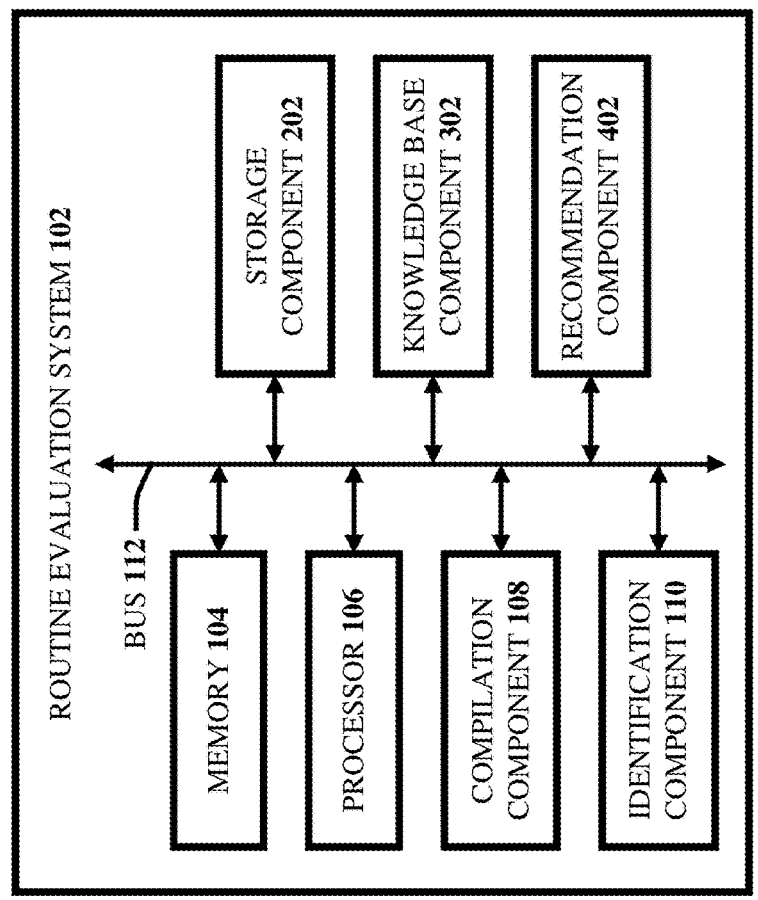

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

As referenced herein, an "entity" can comprise a human, a client, a user, a computing device, a software application, an agent, a machine learning (ML) model, an artificial intelligence (AI), and/or another entity. It will be understood that when an element is referred to herein as being "coupled" to another element, it can describe one or more different types of coupling including, but not limited to, chemical coupling, communicative coupling, electrical coupling, electromagnetic coupling, operative coupling, optical coupling, physical coupling, thermal coupling, and/or another type of coupling.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1, can entangle multiple quantum bits, and use interference.

When running algorithms on near-term quantum devices, the limitations arising from gate errors and environmental interactions place strict limits on the depth and gate count of quantum circuits from which quantum algorithms are composed. Creating efficient quantum circuit optimization methods that reduce the overall gate count and depth of quantum circuits is a major component of the quantum computing toolkit. However, at present, it is not well understood which optimizations are the most beneficial given an arbitrary input circuit. Moreover, the order in which certain optimizations are applied can mean the difference between an optimized circuit, and one that cannot successfully run on hardware. As quantum devices grow in size, this problem is compounded by the fact that blindly applying many optimization passes quickly becomes a bottleneck in performance.

FIGS. 1, 2, 3, and 4 illustrate block diagrams of example, non-limiting systems 100, 200, 300, and 400, respectively, that can each facilitate evaluation of quantum circuit optimization routines and knowledge base generation in accordance with one or more embodiments described herein. System 100, 200, 300, and 400 can each comprise a routine evaluation system 102. Routine evaluation system 102 of system 100 depicted in FIG. 1 can comprise a memory 104, a processor 106, a compilation component 108, an identification component 110, and/or a bus 112. Routine evaluation system 102 of system 200 depicted in FIG. 2 can further comprise a storage component 202. Routine evaluation system 102 of system 300 depicted in FIG. 3 can further comprise a knowledge base component 302. Routine evaluation system 102 of system 400 depicted in FIG. 4 can further comprise a recommendation component 402.

It should be appreciated that the embodiments of the subject disclosure depicted in various figures disclosed herein are for illustration only, and as such, the architecture of such embodiments are not limited to the systems, devices, and/or components depicted therein. For example, in some embodiments, system 100, system 200, system 300, system 400, and/or routine evaluation system 102 can further comprise various computer and/or computing-based elements described herein with reference to operating environment 800 and FIG. 8. In several embodiments, such computer and/or computing-based elements can be used in connection with implementing one or more of the systems, devices, components, and/or computer-implemented operations shown and described in connection with FIG. 1, FIG. 2, FIG. 3, FIG. 4, and/or other figures disclosed herein.

Memory 104 can store one or more computer and/or machine readable, writable, and/or executable components and/or instructions that, when executed by processor 106 (e.g., a classical processor, a quantum processor, and/or another type of processor), can facilitate performance of operations defined by the executable component(s) and/or instruction(s). For example, memory 104 can store computer and/or machine readable, writable, and/or executable components and/or instructions that, when executed by processor 106, can facilitate execution of the various functions described herein relating to routine evaluation system 102, compilation component 108, identification component 110, storage component 202, knowledge base component 302, recommendation component 402, and/or another component associated with routine evaluation system 102 as described herein with or without reference to the various figures of the subject disclosure.

Memory 104 can comprise volatile memory (e.g., random access memory (RAM), static RAM (SRAM), dynamic RAM (DRAM), and/or another type of volatile memory) and/or non-volatile memory (e.g., read only memory (ROM), programmable ROM (PROM), electrically programmable ROM (EPROM), electrically erasable programmable ROM (EEPROM), and/or another type of non-volatile memory) that can employ one or more memory architectures. Further examples of memory 104 are described below with reference to system memory 816 and FIG. 8. Such examples of memory 104 can be employed to implement any embodiments of the subject disclosure.

Processor 106 can comprise one or more types of processors and/or electronic circuitry (e.g., a classical processor, a quantum processor, and/or another type of processor and/or electronic circuitry) that can implement one or more computer and/or machine readable, writable, and/or executable components and/or instructions that can be stored on memory 104. For example, processor 106 can perform various operations that can be specified by such computer and/or machine readable, writable, and/or executable components and/or instructions including, but not limited to, logic, control, input/output (I/O), arithmetic, and/or the like. In some embodiments, processor 106 can comprise one or more central processing unit, multi-core processor, microprocessor, dual microprocessors, microcontroller, System on a Chip (SOC), array processor, vector processor, quantum processor, and/or another type of processor. Further examples of processor 106 are described below with reference to processing unit 814 and FIG. 8. Such examples of processor 106 can be employed to implement any embodiments of the subject disclosure.

Routine evaluation system 102, memory 104, processor 106, compilation component 108, identification component 110, storage component 202, knowledge base component 302, recommendation component 402, and/or another component of routine evaluation system 102 as described herein can be communicatively, electrically, operatively, and/or optically coupled to one another via bus 112 to perform functions of system 100, system 200, system 300, system 400, routine evaluation system 102, and/or any components coupled therewith. Bus 112 can comprise one or more memory bus, memory controller, peripheral bus, external bus, local bus, a quantum bus, and/or another type of bus that can employ various bus architectures. Further examples of bus 112 are described below with reference to system bus 818 and FIG. 8. Such examples of bus 112 can be employed to implement any embodiments of the subject disclosure.

Routine evaluation system 102 can comprise any type of component, machine, device, facility, apparatus, and/or instrument that comprises a processor and/or can be capable of effective and/or operative communication with a wired and/or wireless network. All such embodiments are envisioned. For example, routine evaluation system 102 can comprise a server device, a computing device, a general-purpose computer, a special-purpose computer, a quantum computing device (e.g., a quantum computer), a tablet computing device, a handheld device, a server class computing machine and/or database, a laptop computer, a notebook computer, a desktop computer, a cell phone, a smart phone, a consumer appliance and/or instrumentation, an industrial and/or commercial device, a digital assistant, a multimedia Internet enabled phone, a multimedia players, and/or another type of device.

Routine evaluation system 102 can be coupled (e.g., communicatively, electrically, operatively, optically, and/or coupled via another type of coupling) to one or more external systems, sources, and/or devices (e.g., classical and/or quantum computing devices, communication devices, and/or another type of external system, source, and/or device) using a wire and/or a cable. For example, routine evaluation system 102 can be coupled (e.g., communicatively, electrically, operatively, optically, and/or coupled via another type of coupling) to one or more external systems, sources, and/or devices (e.g., classical and/or quantum computing devices, communication devices, and/or another type of external system, source, and/or device) using a data cable including, but not limited to, a High-Definition Multimedia Interface (HDMI) cable, a recommended standard (RS) 232 cable, an Ethernet cable, and/or another data cable.

In some embodiments, routine evaluation system 102 can be coupled (e.g., communicatively, electrically, operatively, optically, and/or coupled via another type of coupling) to one or more external systems, sources, and/or devices (e.g., classical and/or quantum computing devices, communication devices, and/or another type of external system, source, and/or device) via a network. For example, such a network can comprise wired and/or wireless networks, including, but not limited to, a cellular network, a wide area network (WAN) (e.g., the Internet), a local area network (LAN), and/or another network. Routine evaluation system 102 can communicate with one or more external systems, sources, and/or devices, for instance, computing devices using virtually any desired wired and/or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol, and/or other proprietary and non-proprietary communication protocols. Therefore, in some embodiments, routine evaluation system 102 can comprise hardware (e.g., a central processing unit (CPU), a transceiver, a decoder, quantum hardware, a quantum processor, and/or other hardware), software (e.g., a set of threads, a set of processes, software in execution, quantum pulse schedule, quantum circuit, quantum gates, and/or other software) or a combination of hardware and software that can facilitate communicating information between routine evaluation system 102 and external systems, sources, and/or devices (e.g., computing devices, communication devices, and/or another type of external system, source, and/or device).

Routine evaluation system 102 can comprise one or more computer and/or machine readable, writable, and/or executable components and/or instructions that, when executed by processor 106 (e.g., a classical processor, a quantum processor, and/or another type of processor), can facilitate performance of operations defined by such component(s) and/or instruction(s). Further, in numerous embodiments, any component associated with routine evaluation system 102, as described herein with or without reference to the various figures of the subject disclosure, can comprise one or more computer and/or machine readable, writable, and/or executable components and/or instructions that, when executed by processor 106, can facilitate performance of operations defined by such component(s) and/or instruction(s). For example, compilation component 108, identification component 110, storage component 202, knowledge base component 302, recommendation component 402, and/or any other component associated with routine evaluation system 102 as disclosed herein (e.g., communicatively, electronically, operatively, and/or optically coupled with and/or employed by routine evaluation system 102), can comprise such computer and/or machine readable, writable, and/or executable component(s) and/or instruction(s). Consequently, according to numerous embodiments, routine evaluation system 102 and/or any components associated therewith as disclosed herein, can employ processor 106 to execute such computer and/or machine readable, writable, and/or executable component(s) and/or instruction(s) to facilitate performance of one or more operations described herein with reference to routine evaluation system 102 and/or any such components associated therewith.

Routine evaluation system 102 can facilitate (e.g., via processor 106) performance of operations executed by and/or associated with compilation component 108, identification component 110, storage component 202, knowledge base component 302, recommendation component 402, and/or another component associated with routine evaluation system 102 as disclosed herein. For example, as described in detail below, routine evaluation system 102 can facilitate (e.g., via processor 106): executing, concurrently, different quantum circuit optimization sequences on multiple copies of a quantum circuit; and/or identifying at least one of the different quantum circuit optimization sequences that generates an output quantum circuit comprising defined criteria.

In the above example, as described in detail below, routine evaluation system 102 can further facilitate (e.g., via processor 106): executing, concurrently, the different quantum circuit optimization sequences on the multiple copies of the quantum circuit based on one or more properties of a quantum device that has ability to execute at least one of the quantum circuit or the output quantum circuit; executing, concurrently, the different quantum circuit optimization sequences on the multiple copies of the quantum circuit to generate multiple output quantum circuits respectively comprising different defined criteria and to reduce a processing workload associated with identification of the at least one of the different quantum circuit optimization sequences that generates the output quantum circuit comprising the defined criteria; and/or storing multiple output quantum circuits generated from concurrent execution of the different quantum circuit optimization sequences on the multiple copies of the quantum circuit, where the multiple output quantum circuits respectively comprise different defined criteria. In the above example, the defined criteria can comprise a defined quantum circuit based metric, a defined pulse based metric, and/or another defined criterion.

In another example, as described in detail below, routine evaluation system 102 can facilitate (e.g., via processor 106): generating a knowledge base comprising multiple output quantum circuits generated from concurrent execution of different quantum circuit optimization sequences on multiple copies of a quantum circuit; and/or employing a trained model to recommend at least one of the different quantum circuit optimization sequences to generate an output quantum circuit comprising defined criteria. In this example, as described in detail below, routine evaluation system 102 can further facilitate (e.g., via processor 106): executing, concurrently, the different quantum circuit optimization sequences on the multiple copies of the quantum circuit based on one or more properties of a quantum device that has ability to execute at least one of the quantum circuit or the output quantum circuit; and/or employing, concurrently, the trained model to rank the at least one of the different quantum circuit optimization sequences based on defined entity criteria. In this example, the defined criteria can comprise a defined quantum circuit based metric, a defined pulse based metric, and/or another defined criterion.

Compilation component 108 can execute different quantum circuit optimization sequences on multiple copies of a quantum circuit. For example, compilation component 108 can concurrently execute different quantum circuit optimization sequences on multiple copies of a quantum circuit.

To concurrently execute different quantum circuit optimization sequences on multiple copies of a quantum circuit, compilation component 108 can use, for instance, an application and/or software hook process. For example, compilation component 108 can use such an application and/or software hook process that enables compilation component 108 to send a raw quantum circuit (e.g., a pre-generated quantum circuit) to an external computing resource (e.g., a remote server) that can generate and/or run (e.g., concurrently, in parallel) identical copies (e.g., instances) of the raw quantum circuit through respective, different optimization sequences (e.g., through respective, different quantum circuit optimization routines and/or compilers). In this example, such an external computing resource can comprise a cloud computing node 910 (e.g., a remote server) of cloud computing environment 950 described below with reference to FIG. 9 that can generate identical copies (e.g., instances) of the raw quantum circuit and can further concurrently run (e.g., execute in parallel) the identical copies through respective, different optimization sequences (e.g., through respective, different quantum circuit optimization routines and/or compilers). In some embodiments, the raw quantum circuit referenced above can comprise a fully whole raw quantum circuit (e.g., a fully whole, complete pre-generated quantum circuit). In some embodiments, the raw quantum circuit referenced above can comprise a subset quantum circuit of a fully whole raw quantum circuit (e.g., a subset quantum circuit of a fully whole, complete pre-generated quantum circuit).

Compilation component 108 can concurrently execute the different quantum circuit optimization sequences on the multiple copies of a quantum circuit (e.g., the above described raw quantum circuit) based on one or more properties of a quantum device that has ability to execute the quantum circuit and/or an output quantum circuit that can be generated by compilation component 108 (e.g., via the above described application and/or software hook process and external computing resource (e.g., a remote server)). For example, using the application and/or software hook process described above, compilation component 108 can send a raw quantum circuit (e.g., a fully complete or partial pre-generated quantum circuit) to the above described external computing resource (e.g., a remote server) that can generate and/or run (e.g., concurrently, in parallel) identical copies (e.g., instances) of the raw quantum circuit through respective, different optimization sequences (e.g., through respective, different quantum circuit optimization routines and/or compilers) based on (e.g., using) one or more properties of a quantum device that has ability to execute at least one of the quantum circuit or the output quantum circuit that can be generated by compilation component 108. In this example, the quantum device can comprise, for instance, a quantum computer and the one or more properties of such a quantum device can include, but are not limited to, a specification, configuration properties, operation properties, and/or another property.

In some embodiments, one or more of such different optimization sequences can be obtained by routine evaluation system 102 from, for instance, a vendor (e.g., via a purchase and/or license agreement). In these embodiments, routine evaluation system 102 and/or compilation component 108 can provide such different optimization sequence(s) to the above described external computing resource (e.g., a remote server). In some embodiments, one or more of such different optimization sequences can be provided by an entity as defined herein. For example, an entity as defined herein can utilize an interface component (not illustrated in the figures) of routine evaluation system 102 (e.g., an application programming interface (API), a representational state transfer (REST) API, a graphical user interface (GUI), etc.) to provide one or more of such different optimization sequences. In this example, routine evaluation system 102 and/or compilation component 108 can provide such different optimization sequence(s) provided by the entity to the above described computing resource (e.g., a remote server). In some embodiments, such an entity can request (e.g., via an API, GUI, and/or a REST API of routine evaluation system 102) that compilation component 108 and/or the above described external computing resource (e.g., a remote server) use one or more certain optimization sequences to run (e.g., concurrently) one or more identical copies of the raw quantum circuit.

Compilation component 108 can concurrently execute the different quantum circuit optimization sequences on the multiple copies of the quantum circuit to generate multiple output quantum circuits respectively comprising different defined criteria. For example, using the application and/or software hook process described above, compilation component 108 can send a raw quantum circuit (e.g., a fully complete or partial pre-generated quantum circuit) to the above described external computing resource (e.g., a remote server) that can generate and/or run (e.g., concurrently, in parallel) identical copies (e.g., instances) of the raw quantum circuit through respective, different optimization sequences (e.g., through respective, different quantum circuit optimization routines and/or compilers) to generate such multiple output quantum circuits respectively comprising different defined criteria.

In some embodiments, the multiple output quantum circuits described above can each comprise a fully whole quantum circuit (e.g., a fully whole, complete quantum circuit). For example, in embodiments where the above described raw quantum circuit that can be input to compilation component 108 comprises a fully whole quantum circuit, then the multiple output quantum circuits described above can each comprise a fully whole quantum circuit. In some embodiments, the multiple quantum circuits described above can each comprise a subset quantum circuit of a fully whole raw quantum circuit (e.g., a subset quantum circuit of a fully whole, complete quantum circuit). For example, in embodiments where the above described raw quantum circuit that can be input to compilation component 108 comprises a subset quantum circuit of a fully whole quantum circuit, then the multiple output quantum circuits described above can each comprise a subset quantum circuit of a fully whole quantum circuit.

In some embodiments, such different defined criteria can comprise a defined quantum circuit based metric that can include, but is not limited to, depth (e.g., circuit depth), gate type (e.g., two-qubit gate), number of gates, two-qubit gate count, duration (e.g., gate duration and/or circuit execution duration), fidelity under noisy simulation (e.g., if small enough to be simulated, that is, less than approximately 40 qubits), number of swap gates inserted during compilation, number of measurements, number of gate or state teleportations involved, and/or another defined quantum circuit based metric. In some embodiments, such different defined criteria can comprise a defined pulse based metric that can include, but is not limited to, duration (e.g., pulse duration and/or pulse schedule duration), a frequency component optimization metric (e.g., if the pulse sequence has frequency component(s) in a selected (e.g., defined) range of frequencies), a waveform storage criteria (e.g., defining the number of bits (e.g., qubits) used to store the waveform), and/or another defined pulse based metric.

It should be appreciated that by employing the above described application and/or software hook process to generate (e.g., via a server) such multiple output quantum circuits respectively comprising different defined criteria, routine evaluation system 102 and/or compilation component 108 can thereby reduce a processing workload associated with identification of a quantum circuit optimization sequence that generates the output quantum circuit comprising the defined criteria. For example, rather than employing processor 106 to concurrently or consecutively run a raw quantum circuit through respective, different optimization sequences, routine evaluation system 102 and/or compilation component 108 can employ the above described external computing resource (e.g., a remote server) to concurrently run different quantum circuit optimization sequences on multiple copies of the raw quantum circuit to generate such multiple output quantum circuits respectively comprising different defined criteria. In this example, by employing such an external computing resource to concurrently run different quantum circuit optimization sequences on multiple copies of the raw quantum circuit to generate such multiple output quantum circuits respectively comprising different defined criteria, routine evaluation system 102 and/or compilation component 108 can thereby reduce at least one of the processing workload of processor 106 and/or the time involved with identifying a quantum circuit optimization sequence that generates the output quantum circuit comprising certain defined criteria.

Identification component 110 can identify at least one of the above described different quantum circuit optimization sequences that generates an output quantum circuit comprising defined criteria (e.g., a fully complete or partial output quantum circuit comprising desired and/or target criteria). For example, identification component 110 can identify at least one of the above described different quantum circuit optimization sequences (e.g., different quantum circuit optimization routines and/or compilers) that generates an output quantum circuit comprising certain defined criteria that can be defined by, for instance, the above described entity. For instance, identification component 110 can identify at least one of the above described different quantum circuit optimization sequences (e.g., different quantum circuit optimization routines and/or compilers) that generates an output quantum circuit comprising one or more of the defined quantum circuit based metrics and/or one or more of the defined pulse based metrics, which can be defined by the above described entity. In various embodiments, such an entity can define such defined criteria using, for instance, an API, a GUI, a REST API, and/or another interface component of routine evaluation system 102.

In some embodiments, based on identifying at least one of the above described different quantum circuit optimization sequences that generates an output quantum circuit comprising certain defined criteria (e.g., a fully complete or partial output quantum circuit comprising desired and/or target criteria), identification component 110 can further inform an entity implementing routine evaluation system 102 of the quantum circuit optimization sequence(s) that generated the output quantum circuit comprising the defined criteria and/or provide such an output quantum circuit to the entity. For example, identification component 110 can use an API, a GUI, a REST API, and/or another interface component of routine evaluation system 102 to inform such an entity of the quantum circuit optimization sequence(s) that generated the output quantum circuit comprising the defined criteria and/or to provide such an output quantum circuit to the entity.

Storage component 202 can store multiple output quantum circuits generated from concurrent execution of the different quantum circuit optimization sequences on the multiple copies of the quantum circuit, where the multiple output quantum circuits respectively comprise different defined criteria. For example, storage component 202 can comprise a database and/or a memory (e.g., a memory having the same configuration and/or functionality as that of memory 104) that can store the multiple output quantum circuits that can be concurrently generated by compilation component 108 as described above (e.g., via the application and/or software hook process and a remote server) and that can respectively comprise different defined criteria (e.g., metrics). In this example, storage component 202 can also store such different defined criteria corresponding respectively to the multiple quantum circuits. In this example, storage component 202 can further store various raw quantum circuits that can be input to routine evaluation system 102 by different entities implementing routine evaluation system 102.

Knowledge base component 302 can generate a knowledge base comprising multiple output quantum circuits generated from concurrent execution of different quantum circuit optimization sequences on multiple copies of a quantum circuit. For example, knowledge base component 302 can employ a knowledge base generation process, application, and/or software to generate a knowledge base comprising, for instance: various raw quantum circuits that can be input to routine evaluation system 102 by different entities implementing routine evaluation system 102; the different quantum circuit optimization sequences that can be used (e.g., by compilation component 108 and/or a remote server as described above) to concurrently execute the multiple copies of such various raw quantum circuits; the multiple output quantum circuits that can be concurrently generated by such different quantum circuit optimization sequences; and/or the different defined criteria (e.g., metrics) of such multiple output quantum circuits. In this example, knowledge base component 302 can obtain the various raw quantum circuits, the multiple output quantum circuits, and/or the different defined criteria (e.g., metrics) corresponding respectively to the multiple output quantum circuits from storage component 202. In this example, knowledge base component 302 can obtain the different quantum circuit optimization sequences (e.g., knowledge base component 302 can obtain identification data that identifies each of such different quantum circuit optimization sequences) from, for instance, compilation component 108 and/or the above described external computing resource (e.g., a remote server) that can be employed by compilation component 108.

Recommendation component 402 can employ a trained model to recommend (e.g., to an entity implementing routine evaluation system 102) at least one of the different quantum circuit optimization sequences to generate an output quantum circuit comprising defined criteria. For example, recommendation component 402 can employ a trained machine learning (ML) and/or artificial intelligence (AI) model that has been trained to recommend (e.g., to an entity implementing routine evaluation system 102) at least one of the different quantum circuit optimization sequences that can be employed by compilation component 108 (e.g., via the above described application and/or software hook process and a remote server) to generate an output quantum circuit comprising defined criteria (e.g., metrics). In this example, such a trained model can include, but is not limited to, a trained neural network, a trained deep neural network, a trained classifier model, a trained predictive model, a trained support vector machine, and/or another trained model. In this example, such a trained model can be trained using a learning process including, but not limited to, a supervised learning process, an unsupervised learning process, an active learning process, and/or another learning process. In this example, such a trained model can be trained using, for instance, the above described knowledge base that can be generated by knowledge base component 302 as training data.

In some embodiments, upon obtaining enough statistics (e.g., a large number of the multiple output quantum circuits respectively comprising different defined criteria (e.g., metrics)), the certain quantum circuit optimization sequence(s) that work relatively best on the raw quantum circuit input by an entity implementing routine evaluation system 102 can be identified (e.g., via identification component 110) and/or recommended (e.g., via recommendation component 402) to the entity (e.g., via an API, a GUI, and/or a REST API of routine evaluation system 102) as potential option(s) to perform further quantum circuit optimizations. In some embodiments, knowledge base component 302 can generate a knowledge base comprising various quantum circuit optimization data aggregated from multiple entities implementing routine evaluation system 102 using various input raw quantum circuits. In some embodiments, such a knowledge base can serve as a database that can be used as training data to train an ML and/or AI model (e.g., an ML and/or AI algorithm) to determine which quantum circuit optimization routine(s) works relatively best for a given input raw quantum circuit before performing the actual optimization sequence.

It should be appreciated that routine evaluation system 102 solves the problem of identifying which quantum circuit optimization routine(s) works relatively best for a given input raw quantum circuit in the short term by, for instance, transparently running a collection of different quantum circuit optimization sequences on a remote server, so as to not reduce performance routine evaluation system 102, and storing the output quantum circuits respectively having defined criteria to recommend the relatively best quantum circuit optimization procedure to an entity implementing routine evaluation system 102. It should also be appreciated that routine evaluation system 102 further provides a long-term solution to this problem by providing a knowledge base comprising, for instance: various raw quantum circuits that can be input to routine evaluation system 102 by different entities implementing routine evaluation system 102; the different quantum circuit optimization sequences that can be used (e.g., by compilation component 108 and/or a remote server as described above) to concurrently execute the multiple copies of such various raw quantum circuits; the multiple output quantum circuits that can be concurrently generated by such different quantum circuit optimization sequences; and/or the different defined criteria (e.g., metrics) of such multiple output quantum circuits. That is, for example, it should also be appreciated that routine evaluation system 102 further provides a long-term solution to this problem by providing such a knowledge base that can be used to train an ML and/or AI model (e.g., an ML and/or AI algorithm) to identify which quantum circuit optimization sequence(s) works relatively best for a given input raw quantum circuit.

Figure 5:
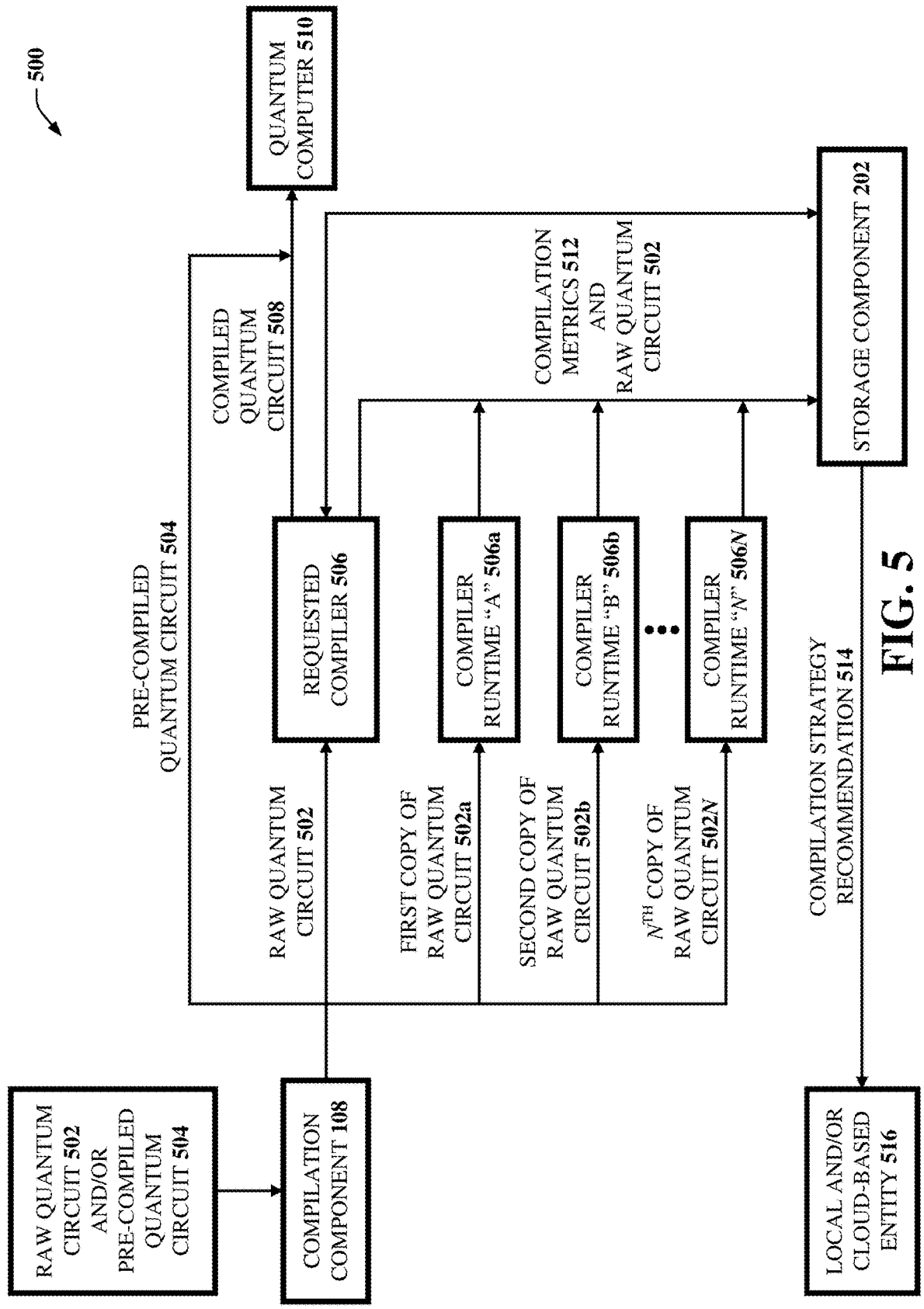

FIG. 5 illustrates a block diagram of an example, non-limiting system that can facilitate evaluation of quantum circuit optimization routines and knowledge base generation in accordance with one or more embodiments described herein. Repetitive description of like elements and/or processes employed in respective embodiments is omitted for sake of brevity.

As illustrated in the example embodiment depicted in FIG. 5, compilation component 108 can receive as input (e.g., via an API, a GUI, a REST API, and/or another interface component of routine evaluation system 102) a raw quantum circuit 502 and/or a pre-compiled quantum circuit 504. Raw quantum circuit 502 can comprise the same configuration and/or functionality as that of the raw quantum circuit described above with reference to the example embodiments illustrated in FIGS. 1, 2, 3, and 4. In some embodiments, raw quantum circuit 502 can comprise a fully whole raw quantum circuit (e.g., a fully whole, complete pre-generated quantum circuit). In some embodiments, raw quantum circuit 502 can comprise a subset quantum circuit of a fully whole raw quantum circuit (e.g., a subset quantum circuit of a fully whole, complete pre-generated quantum circuit).

In the example embodiment depicted in FIG. 5, compilation component 108 can send raw quantum circuit 502 to a requested compiler 506 that can be requested (e.g., via an API, a GUI, a REST API, and/or another interface component of routine evaluation system 102) by an entity defined herein to generate a compiled quantum circuit 508. In this example embodiment, compilation component 108 and requested compiler 506 can respectively send pre-compiled quantum circuit 504 and compiled quantum circuit 508 to a quantum computer 510, where quantum computer 510 can execute pre-compiled quantum circuit 504 and/or compiled quantum circuit 508.

In the example embodiment depicted in FIG. 5, compilation component 108 can facilitate the generation of multiple copies of raw quantum circuit 502 and can further facilitate concurrent execution of different quantum circuit optimization sequences on such multiple copies of raw quantum circuit 502. For example, compilation component 108 can use the above described application and/or software hook process that enables compilation component 108 to send raw quantum circuit 502 to an external computing resource (e.g., a remote server, not illustrated in FIG. 5) that can generate and/or run (e.g., concurrently, in parallel) identical copies (e.g., instances) of raw quantum circuit 502 through respective, different optimization sequences (e.g., through respective, different quantum circuit optimization routines and/or compilers).

As illustrated in the example embodiment depicted in FIG. 5, compilation component 108 can use the above described application and/or software hook process to send raw quantum circuit 502 to, for instance, a remote server (not illustrated in FIG. 5) that can generate a first copy of raw quantum circuit 502a, a second copy of raw quantum circuit 502b, and/or an $N^{th}$ copy of raw quantum circuit 502N (e.g., where N denotes a total quantity of copies of raw quantum circuit 502). In this example embodiment, first copy of raw quantum circuit 502a, second copy of raw quantum circuit 502b, and/or $N^{th}$ copy of raw quantum circuit 502N can each comprise an identical copy of raw quantum circuit 502. In this example embodiment, compilation component 108 can further use such an application and/or software hook process and the remote server to concurrently run (e.g., in parallel): first copy of raw quantum circuit 502a through a compiler runtime "A" 506a; second copy of raw quantum circuit 502b through a compiler runtime "B" 506b; and $N^{th}$ copy of raw quantum circuit 502N through a compiler runtime "N" 506N. In this example embodiment, compiler runtime "A" 506a, compiler runtime "B" 506b, and compiler runtime "N" 506N, can each comprise different quantum circuit optimization sequences (e.g., different quantum circuit optimization routines) that can be respectively executed on first copy of raw quantum circuit 502a, second copy of raw quantum circuit 502b, and $N^{th}$ copy of raw quantum circuit 502N.

In the example embodiment illustrated in FIG. 5, based on the above described concurrent execution of the respective copies of raw quantum circuit 502 by compiler runtime "A" 506a, compiler runtime "B" 506b, and compiler runtime "N" 506N, multiple output quantum circuits respectively comprising different defined criteria can be generated and/or stored in storage component 202. For example, as illustrated in the example embodiment depicted in FIG. 5, based on the above described concurrent execution of the respective copies of raw quantum circuit 502 by compiler runtime "A" 506a, compiler runtime "B" 506b, and compiler runtime "N" 506N, multiple output quantum circuits respectively comprising compilation metrics 512 can be generated and/or stored in storage component 202. In some embodiments, the multiple output quantum circuits described above can each comprise a fully whole quantum circuit (e.g., a fully whole, complete quantum circuit). For example, in embodiments where raw quantum circuit 502 comprises a fully whole quantum circuit, then the multiple output quantum circuits described above can each comprise a fully whole quantum circuit. In some embodiments, the multiple quantum circuits described above can each comprise a subset quantum circuit of a fully whole raw quantum circuit (e.g., a subset quantum circuit of a fully whole, complete quantum circuit). For example, in embodiments where raw quantum circuit 502 comprises a subset quantum circuit of a fully whole quantum circuit, then the multiple output quantum circuits described above can each comprise a subset quantum circuit of a fully whole quantum circuit.

Compilation metrics 512 can comprise the same data as that of the defined criteria and/or the different defined criteria described above with reference to the example embodiments illustrated in FIGS. 1, 2, 3, and 4. For example, compilation metrics 512 can comprise a defined quantum circuit based metric that can include, but is not limited to, depth (e.g., circuit depth), gate type (e.g., two-qubit gate), number of gates, two-qubit gate count, duration (e.g., gate duration and/or circuit execution duration), fidelity under noisy simulation (e.g., if small enough to be simulated, that is, less than approximately 40 qubits), number of swap gates inserted during compilation, number of measurements, number of gate or state teleportations involved, and/or another defined quantum circuit based metric. In another example, compilation metrics 512 can comprise a defined pulse based metric that can include, but is not limited to, duration (e.g., pulse duration and/or pulse schedule duration), a frequency component optimization metric (e.g., if the pulse sequence has frequency component(s) in a selected (e.g., defined) range of frequencies), a waveform storage criteria (e.g., defining the number of bits (e.g., qubits) used to store the waveform), and/or another defined pulse based metric.

In some embodiments, requested compiler 506 can obtain, from storage component 202, the above described multiple output quantum circuits respectively comprising compilation metrics 512 and/or compilation metrics 512 themselves. For example, requested compiler 506 can obtain, from storage component 202, the above described multiple output quantum circuits (e.g., fully complete or partial output quantum circuits) respectively comprising compilation metrics 512 and/or compilation metrics 512 themselves to facilitate processing of raw quantum circuit 502 and/or generation of compiled quantum circuit 508.

Although not illustrated in the example embodiment depicted in FIG. 5, based on generation of the above described multiple output quantum circuits respectively comprising compilation metrics 512, identification component 110 can determine whether compiler runtime "A" 506a, compiler runtime "B" 506b, and/or compiler runtime "N" 506N generated an output quantum circuit comprising defined criteria (e.g., a fully complete or partial output quantum circuit comprising desired and/or target criteria that can be defined by an entity implementing routine evaluation system 102). For example, based on generation of the above described multiple output quantum circuits respectively comprising compilation metrics 512, identification component 110 can determine whether compiler runtime "A" 506a, compiler runtime "B" 506b, and/or compiler runtime "N" 506N generated an output quantum circuit comprising one or more of the defined quantum circuit based metrics and/or one or more of the defined pulse based metrics described above that can be defined by a local and/or cloud-based entity 516 depicted in FIG. 5. Local and/or cloud based entity 516 can comprise an entity as defined herein that can implement routine evaluation system 102.

In embodiments where identification component 110 determines that compiler runtime "A" 506a, compiler runtime "B" 506b, and/or compiler runtime "N" 506N generated an output quantum circuit comprising the above described defined criteria, identification component 110 can further inform (e.g., via an API, a GUI, a REST API, and/or another interface component of routine evaluation system 102) local and/or cloud-based entity 516 of such a determination by identification component 110. Additionally, or alternatively, in these embodiments, identification component 110 can further provide such an output quantum circuit to local and/or cloud-based entity 516 (e.g., via an API, a GUI, a REST API, and/or another interface component of routine evaluation system 102).

Although not illustrated in the example embodiment depicted in FIG. 5, based on generation and storage of the above described multiple output quantum circuits respectively comprising compilation metrics 512, knowledge base component 302 can generate (e.g., as described above with reference to the example embodiments illustrated in FIGS. 1, 2, 3, and 4) a knowledge base comprising such multiple output quantum circuits and/or compilation metrics 512. For example, knowledge base component 302 can employ a knowledge base generation process, application, and/or software to generate a knowledge base comprising, for instance: various raw quantum circuits 502 that can be input to compilation component 108 by different local and/or cloud-based entities 516 implementing system 500; various quantum circuit optimization sequences that can be used by compiler runtime "A" 506a, compiler runtime "B" 506b, and/or compiler runtime "N" 506N to concurrently and respectively execute copies of such various raw quantum circuits 502; various output quantum circuits comprising various compilation metrics 512; and/or various compilation metrics 512.

In the above example, knowledge base component 302 can obtain the various raw quantum circuits 502, the various output quantum circuits comprising various compilation metrics 512, and/or the various compilation metrics 512 from storage component 202. In this example, knowledge base component 302 can obtain the various quantum circuit optimization sequences from, for instance: compilation component 108; the above described remote server that can be employed by compilation component 108; compiler runtime "A" 506a; compiler runtime "B" 506b; and/or compiler runtime "N" 506N.

Although not illustrated in the example embodiment depicted in FIG. 5, based on generation of the above described knowledge base, recommendation component 402 can employ a trained model to recommend a compilation strategy recommendation 514 to local and/or cloud-based entity 516 (e.g., via an API, a GUI, a REST API, and/or another interface component of routine evaluation system 102). For example, recommendation component 402 can employ a trained ML and/or AI model that has been trained (e.g., using the above described knowledge base that can be generated by knowledge base component 302) to recommend compilation strategy recommendation 514. In this example, compilation strategy recommendation 514 can comprise at least one of the different quantum circuit optimization sequences that can be employed by compiler runtime "A" 506a, compiler runtime "B" 506b, and/or compiler runtime "N" 506N to generate an output quantum circuit comprising compilation metrics 512. In this example, such a trained model can include, but is not limited to, a trained neural network, a trained deep neural network, a trained classifier model, a trained predictive model, a trained support vector machine, and/or another trained model. In this example, such a trained model can be trained using a learning process including, but not limited to, a supervised learning process, an unsupervised learning process, an active learning process, and/or another learning process. In this example, such a trained model can be trained using, for instance, the above described knowledge base that can be generated by knowledge base component 302 as training data.

Figure 6:
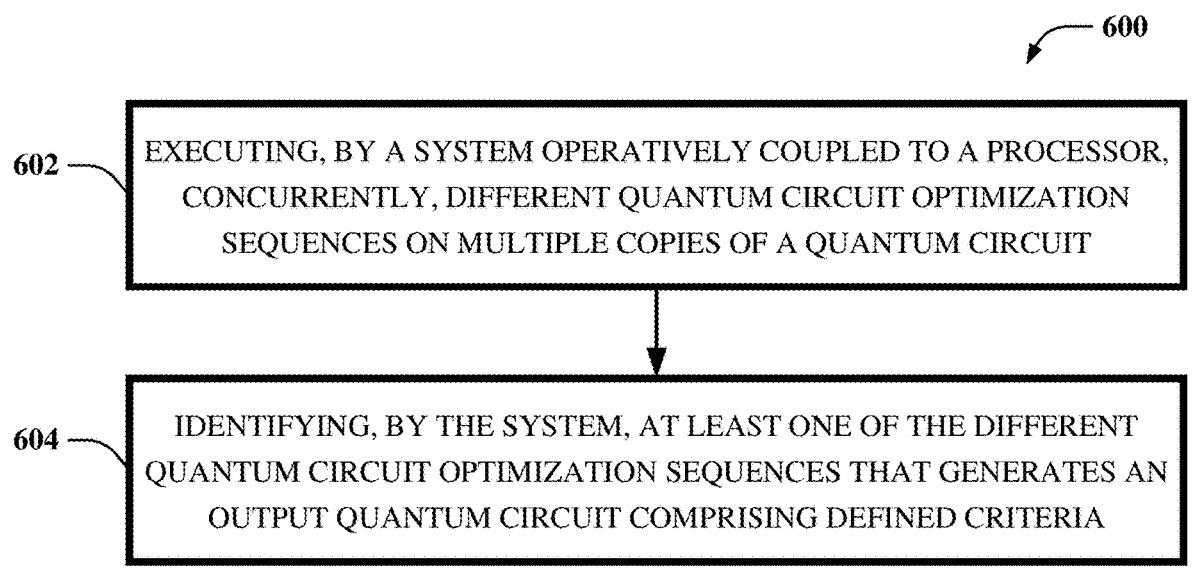
FIGS. 6 and 7 illustrate flow diagrams of example, non-limiting computer-implemented methods that can facilitate evaluation of quantum circuit optimization routines and knowledge base generation in accordance with one or more embodiments described herein.

FIG. 6 illustrates a flow diagram of an example, non-limiting computer-implemented method 600 that can facilitate evaluation of quantum circuit optimization routines and knowledge base generation in accordance with one or more embodiments described herein. Repetitive description of like elements and/or processes employed in respective embodiments is omitted for sake of brevity.

At 602, computer-implemented method 600 can comprise executing, by a system (e.g., via routine evaluation system 102 and/or compilation component 108) operatively coupled to a processor (e.g., processor 106), concurrently, different quantum circuit optimization sequences on multiple copies of a quantum circuit. For example, as described above with reference to the example embodiment depicted in FIG. 5, compilation component 108 can employ an application and/or software hook process to use a remote server that can concurrently execute different quantum circuit optimization sequences on multiple copies of raw quantum circuit 502 (e.g., on first copy of raw quantum circuit 502a, second copy of raw quantum circuit 502b, and $N^{th}$ copy of raw quantum circuit 502N) using compiler runtime "A" 506a, compiler runtime "B" 506b, and/or compiler runtime "N" 506N.

At 604, computer-implemented method 600 can comprise identifying, by the system (e.g., via routine evaluation system 102 and/or identification component 110), at least one of the different quantum circuit optimization sequences that generates an output quantum circuit comprising defined criteria. For example, as described above with reference to the example embodiment depicted in FIG. 5, based on generation of the multiple output quantum circuits respectively comprising compilation metrics 512, identification component 110 can determine whether compiler runtime "A" 506a, compiler runtime "B" 506b, and/or compiler runtime "N" 506N generated an output quantum circuit comprising one or more of the defined quantum circuit based metrics and/or one or more of the defined pulse based metrics described above.

Figure 7:
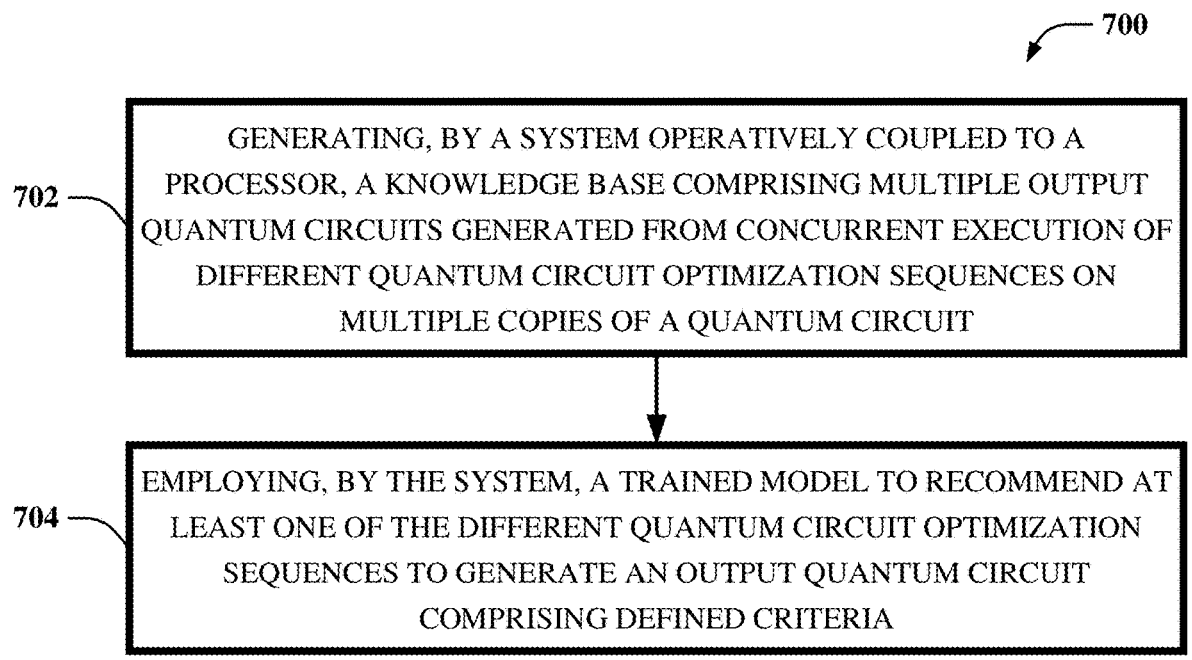

FIG. 7 illustrates a flow diagram of an example, non-limiting computer-implemented method 700 that can facilitate evaluation of quantum circuit optimization routines and knowledge base generation in accordance with one or more embodiments described herein. Repetitive description of like elements and/or processes employed in respective embodiments is omitted for sake of brevity.

At 702, computer-implemented method 700 can comprise generating, by a system (e.g., via routine evaluation system 102 and/or knowledge base component 302) operatively coupled to a processor (e.g., processor 106), a knowledge base comprising multiple output quantum circuits generated from concurrent execution of different quantum circuit optimization sequences on multiple copies of a quantum circuit. For example, as described above with reference to the example embodiment depicted in FIG. 5, knowledge base component 302 can generate (e.g., as described above with reference to the example embodiments illustrated in FIGS. 1, 2, 3, and 4) a knowledge base comprising, for instance: various raw quantum circuits 502 that can be input to compilation component 108 by different local and/or cloud-based entities 516 implementing system 500; various quantum circuit optimization sequences that can be used by compiler runtime "A" 506a, compiler runtime "B" 506b, and/or compiler runtime "N" 506N to concurrently and respectively execute copies of such various raw quantum circuits 502; various output quantum circuits comprising various compilation metrics 512; and/or various compilation metrics 512.

At 704, computer-implemented method 700 can comprise employing, by the system (e.g., via routine evaluation system 102 and/or recommendation component 402), a trained model to recommend at least one of the different quantum circuit optimization sequences to generate an output quantum circuit comprising defined criteria. For example, as described above with reference to the example embodiment depicted in FIG. 5, recommendation component 402 can employ a trained ML and/or AI model that has been trained (e.g., using the above described knowledge base that can be generated by knowledge base component 302) to recommend compilation strategy recommendation 514. In this example, compilation strategy recommendation 514 can comprise at least one of the different quantum circuit optimization sequences that can be employed by compiler runtime "A" 506a, compiler runtime "B" 506b, and/or compiler runtime "N" 506N to generate an output quantum circuit comprising compilation metrics 512.

Routine evaluation system 102 can be associated with various technologies. For example, routine evaluation system 102 can be associated with quantum computing technologies, quantum circuit technologies, quantum circuit optimization technologies, quantum hardware and/or software technologies, quantum algorithm technologies, machine learning technologies, artificial intelligence technologies, cloud computing technologies, knowledge base technologies, and/or other technologies.

Routine evaluation system 102 can provide technical improvements to systems, devices, components, operational steps, and/or processing steps associated with the various technologies identified above. For example, routine evaluation system 102 can: concurrently execute different quantum circuit optimization sequences on multiple copies of a quantum circuit; and/or identify at least one of the different quantum circuit optimization sequences that generates an output quantum circuit comprising defined criteria. In this example, to concurrently execute different quantum circuit optimization sequences on multiple copies of a quantum circuit, routine evaluation system 102 can use the above described application and/or software hook process that enables routine evaluation system 102 (e.g., via compilation component 108) to send a raw quantum circuit to an external computing resource (e.g., a remote server) that can generate and/or run (e.g., concurrently, in parallel) identical copies (e.g., instances) of the raw quantum circuit through respective, different optimization sequences (e.g., through respective, different quantum circuit optimization routines and/or compilers). In this example, by employing such an external computing resource to concurrently run different quantum circuit optimization sequences on multiple copies of the raw quantum circuit and generate multiple output quantum circuits respectively comprising different defined criteria, routine evaluation system 102 can thereby reduce at least one of the processing workload of a processor (e.g., processor 106) and/or the time involved with identifying a quantum circuit optimization sequence that generates the output quantum circuit comprising certain defined criteria. In another example, routine evaluation system 102 can further provide (e.g., via knowledge base component 302) a knowledge base that can be used to train an ML and/or AI model (e.g., an ML and/or AI algorithm) to identify which quantum circuit optimization sequence(s) works relatively best for a given input raw quantum circuit.

Routine evaluation system 102 can provide technical improvements to a processing unit (e.g., processor 106, a quantum processor, and/or another processor) associated with routine evaluation system 102. For example, as described above, by employing such an external computing resource to concurrently run different quantum circuit optimization sequences on multiple copies of the raw quantum circuit and generate multiple output quantum circuits respectively comprising different defined criteria, routine evaluation system 102 can thereby reduce the processing workload of a processor (e.g., processor 106) involved with identifying a quantum circuit optimization sequence that generates the output quantum circuit comprising certain defined criteria. In this example, by reducing the processing workload of such a processor (e.g., processor 106), routine evaluation system 102 can thereby facilitate improved performance and/or efficiency of such a processor, as well as reduced computational costs of such a processor.

A practical application of routine evaluation system 102 is that it can be implemented using a classical computing device (e.g., a classical processor and/or a classical computer) to identify a quantum circuit optimization sequence (e.g., routine and/or compiler) that can generate a quantum circuit having desired and/or target criteria, where such a quantum circuit can be executed on a quantum computing device (e.g., a quantum processor and/or a quantum computer) to compute one or more solutions (e.g., heuristic(s)) to a variety of problems ranging in complexity (e.g., an estimation problem, an optimization problem, and/or another problem) in a variety of domains (e.g., finance, chemistry, medicine, and/or another domain). For example, a practical application of routine evaluation system 102 is that it can be implemented using a classical computing device (e.g., a classical processor and/or a classical computer) to identify a quantum circuit optimization sequence (e.g., routine and/or compiler) that can generate a quantum circuit having desired and/or target criteria, where such a quantum circuit can be executed on a quantum computing device (e.g., a quantum processor and/or a quantum computer) to compute one or more solutions (e.g., heuristic(s)) to an estimation problem and/or an optimization problem in the domain of chemistry, medicine, and/or finance, where such a solution can be used to engineer, for instance, a new chemical compound, a new medication, and/or a new option premium.

It should be appreciated that routine evaluation system 102 provides a new approach driven by relatively new quantum computing technologies. For example, routine evaluation system 102 provides a new approach to identify a quantum circuit optimization sequence (e.g., routine and/or compiler) that can generate a quantum circuit having desired and/or target criteria.

Routine evaluation system 102 can employ hardware or software to solve problems that are highly technical in nature, that are not abstract and that cannot be performed as a set of mental acts by a human. In some embodiments, one or more of the processes described herein can be performed by one or more specialized computers (e.g., a specialized processing unit, a specialized classical computer, a specialized quantum computer, and/or another type of specialized computer) to execute defined tasks related to the various technologies identified above. Routine evaluation system 102 and/or components thereof, can be employed to solve new problems that arise through advancements in technologies mentioned above, employment of quantum computing systems, cloud computing systems, computer architecture, and/or another technology.

It is to be appreciated that routine evaluation system 102 can utilize various combinations of electrical components, mechanical components, and circuitry that cannot be replicated in the mind of a human or performed by a human, as the various operations that can be executed by routine evaluation system 102 and/or components thereof as described herein are operations that are greater than the capability of a human mind. For instance, the amount of data processed, the speed of processing such data, or the types of data processed by routine evaluation system 102 over a certain period of time can be greater, faster, or different than the amount, speed, or data type that can be processed by a human mind over the same period of time.

According to several embodiments, routine evaluation system 102 can also be fully operational towards performing one or more other functions (e.g., fully powered on, fully executed, and/or another function) while also performing the various operations described herein. It should be appreciated that such simultaneous multi-operational execution is beyond the capability of a human mind. It should also be appreciated that routine evaluation system 102 can include information that is impossible to obtain manually by an entity, such as a human user. For example, the type, amount, and/or variety of information included in routine evaluation system 102, compilation component 108, identification component 110, storage component 202, knowledge base component 302, and/or recommendation component 402 can be more complex than information obtained manually by a human user.

In some embodiments, routine evaluation system 102 can be associated with a cloud computing environment. For example, routine evaluation system 102 can be associated with cloud computing environment 950 described below with reference to FIG. 9 and/or one or more functional abstraction layers described below with reference to FIG. 10 (e.g., hardware and software layer 1060, virtualization layer 1070, management layer 1080, and/or workloads layer 1090).

Routine evaluation system 102 and/or components thereof (e.g., compilation component 108, identification component 110, storage component 202, knowledge base component 302, recommendation component 402, and/or another component) can employ one or more computing resources of cloud computing environment 950 described below with reference to FIG. 9 and/or one or more functional abstraction layers (e.g., quantum software) described below with reference to FIG. 10 to execute one or more operations in accordance with one or more embodiments of the subject disclosure described herein. For example, cloud computing environment 950 and/or such one or more functional abstraction layers can comprise one or more classical computing devices (e.g., classical computer, classical processor, virtual machine, server, and/or another classical computing device), quantum hardware, and/or quantum software (e.g., quantum computing device, quantum computer, quantum processor, quantum circuit simulation software, superconducting circuit, and/or other quantum hardware and/or quantum software) that can be employed by routine evaluation system 102 and/or components thereof to execute one or more operations in accordance with one or more embodiments of the subject disclosure described herein. For instance, routine evaluation system 102 and/or components thereof can employ such one or more classical and/or quantum computing resources to execute one or more classical and/or quantum: mathematical function, calculation, and/or equation; computing and/or processing script, routine, and/or instruction; algorithm; model (e.g., artificial intelligence (AI) model, machine learning (ML) model, and/or another type of model); and/or another operation in accordance with one or more embodiments of the subject disclosure described herein.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 8:
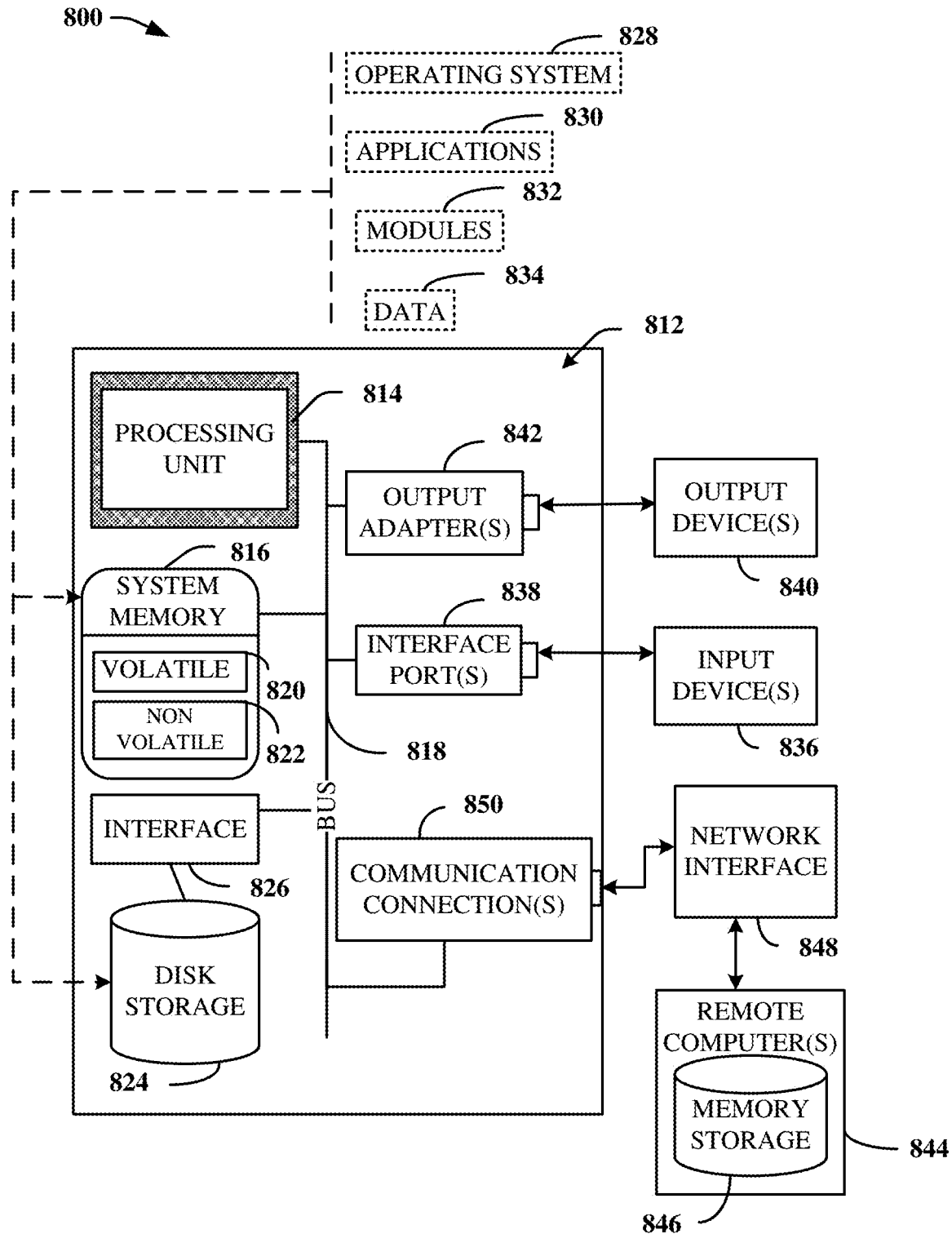
FIG. 8 illustrates a block diagram of an example, non-limiting operating environment in which one or more embodiments described herein can be facilitated.

In order to provide a context for the various aspects of the disclosed subject matter, FIG. 8 as well as the following discussion are intended to provide a general description of a suitable environment in which the various aspects of the disclosed subject matter can be implemented. FIG. 8 illustrates a block diagram of an example, non-limiting operating environment in which one or more embodiments described herein can be facilitated. Repetitive description of like elements employed in other embodiments described herein is omitted for sake of brevity.

With reference to FIG. 8, a suitable operating environment 800 for implementing various aspects of this disclosure can also include a computer 812. The computer 812 can also include a processing unit 814, a system memory 816, and a system bus 818. The system bus 818 couples system components including, but not limited to, the system memory 816 to the processing unit 814. The processing unit 814 can be any of various available processors. Dual microprocessors and other multiprocessor architectures also can be employed as the processing unit 814. The system bus 818 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 816 can also include volatile memory 820 and nonvolatile memory 822. The basic input/output system (BIOS), containing the basic routines to transfer information between elements within the computer 812, such as during start-up, is stored in nonvolatile memory 822. Computer 812 can also include removable/non-removable, volatile/non-volatile computer storage media. FIG. 8 illustrates, for example, a disk storage 824. Disk storage 824 can also include, but is not limited to, devices like a magnetic disk drive, floppy disk drive, tape drive, Jaz drive, Zip drive, LS-100 drive, flash memory card, or memory stick. The disk storage 824 also can include storage media separately or in combination with other storage media. To facilitate connection of the disk storage 824 to the system bus 818, a removable or non-removable interface is typically used, such as interface 826. FIG. 8 also depicts software that acts as an intermediary between users and the basic computer resources described in the suitable operating environment 800. Such software can also include, for example, an operating system 828. Operating system 828, which can be stored on disk storage 824, acts to control and allocate resources of the computer 812.

System applications 830 take advantage of the management of resources by operating system 828 through program modules 832 and program data 834, e.g., stored either in system memory 816 or on disk storage 824. It is to be appreciated that this disclosure can be implemented with various operating systems or combinations of operating systems. A user enters commands or information into the computer 812 through input device(s) 836. Input devices 836 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 814 through the system bus 818 via interface port(s) 838. Interface port(s) 838 include, for example, a serial port, a parallel port, a game port, and a universal serial bus (USB). Output device(s) 840 use some of the same type of ports as input device(s) 836. Thus, for example, a USB port can be used to provide input to computer 812, and to output information from computer 812 to an output device 840. Output adapter 842 is provided to illustrate that there are some output devices 840 like monitors, speakers, and printers, among other output devices 840, which require special adapters. The output adapters 842 include, by way of illustration and not limitation, video and sound cards that provide a means of connection between the output device 840 and the system bus 818. It should be noted that other devices and/or systems of devices provide both input and output capabilities such as remote computer(s) 844.

Computer 812 can operate in a networked environment using logical connections to one or more remote computers, such as remote computer(s) 844. The remote computer(s) 844 can be a computer, a server, a router, a network PC, a workstation, a microprocessor based appliance, a peer device or other common network node and the like, and typically can also include many or all of the elements described relative to computer 812. For purposes of brevity, only a memory storage device 846 is illustrated with remote computer(s) 844. Remote computer(s) 844 is logically connected to computer 812 through a network interface 848 and then physically connected via communication connection 850. Network interface 848 encompasses wire and/or wireless communication networks such as local-area networks (LAN), wide-area networks (WAN), cellular networks, and/or another wire and/or wireless communication network. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 850 refers to the hardware/software employed to connect the network interface 848 to the system bus 818. While communication connection 850 is shown for illustrative clarity inside computer 812, it can also be external to computer 812. The hardware/software for connection to the network interface 848 can also include, for exemplary purposes only, internal and external technologies such as, modems including regular telephone grade modems, cable modems and DSL modems, ISDN adapters, and Ethernet cards.

Figure 9:
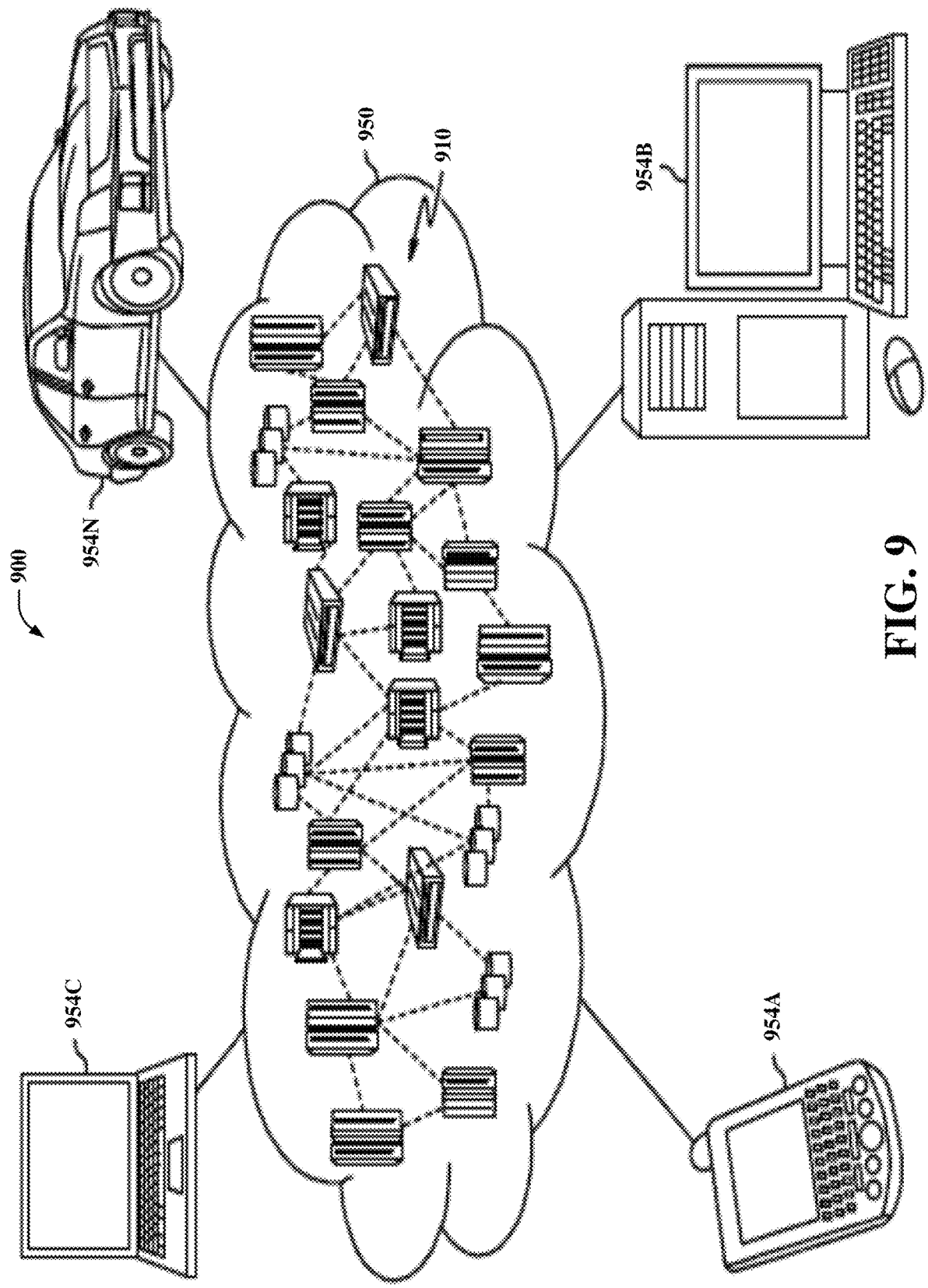
FIG. 9 illustrates a block diagram of an example, non-limiting cloud computing environment in accordance with one or more embodiments of the subject disclosure.

Referring now to FIG. 9, an illustrative cloud computing environment 950 is depicted. As shown, cloud computing environment 950 includes one or more cloud computing nodes 910 with which local computing devices used by cloud consumers, such as, for example, personal digital assistant (PDA) or cellular telephone 954A, desktop computer 954B, laptop computer 954C, and/or automobile computer system 954N may communicate. Although not illustrated in FIG. 9, cloud computing nodes 910 can further comprise a quantum platform (e.g., quantum computer, quantum hardware, quantum software, and/or another quantum platform) with which local computing devices used by cloud consumers can communicate. Nodes 910 may communicate with one another. They may be grouped (not shown) physically or virtually, in one or more networks, such as Private, Community, Public, or Hybrid clouds as described hereinabove, or a combination thereof. This allows cloud computing environment 950 to offer infrastructure, platforms and/or software as services for which a cloud consumer does not need to maintain resources on a local computing device. It is understood that the types of computing devices 954A-N shown in FIG. 9 are intended to be illustrative only and that computing nodes 910 and cloud computing environment 950 can communicate with any type of computerized device over any type of network and/or network addressable connection (e.g., using a web browser).

Figure 10:
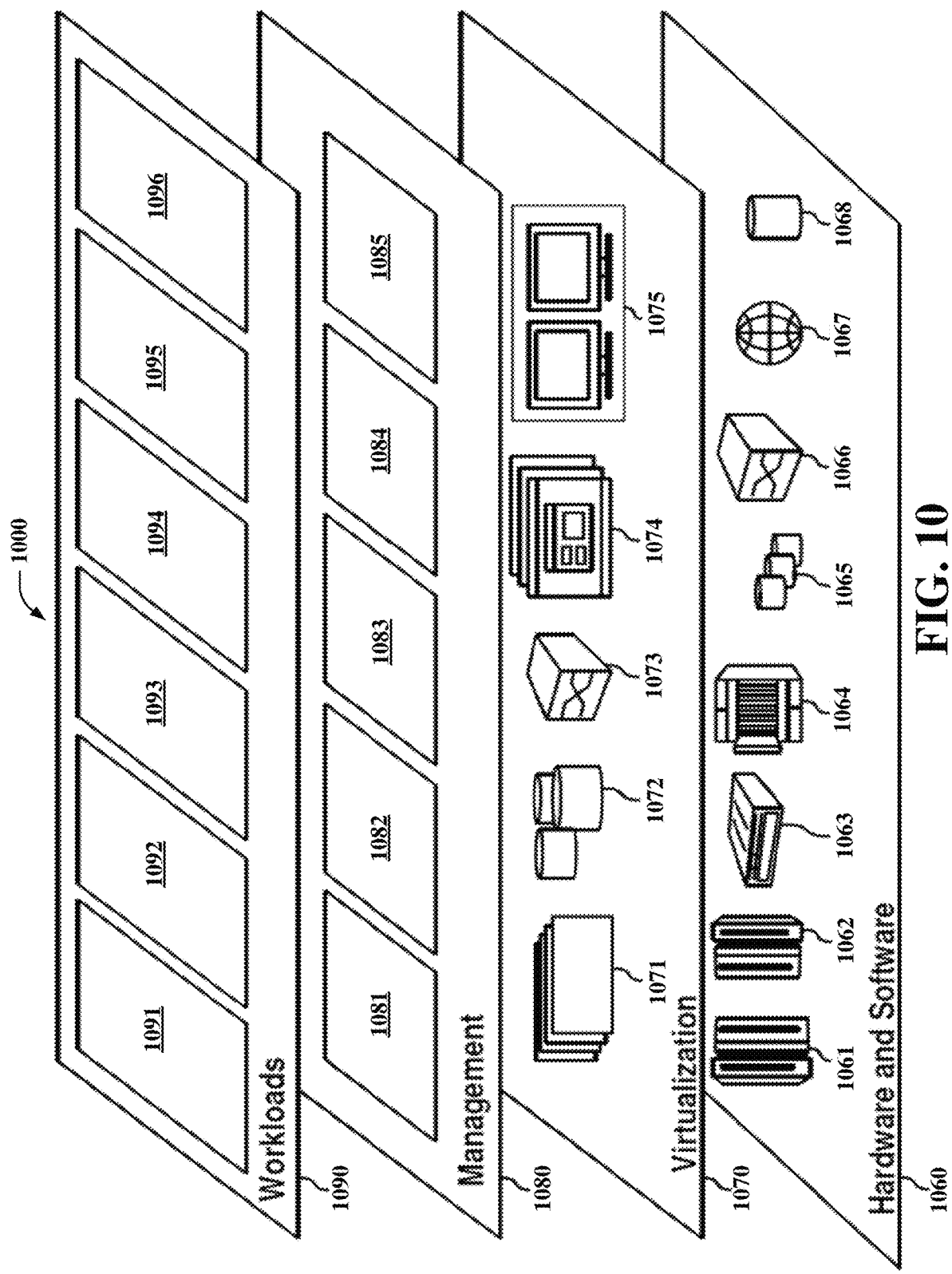
FIG. 10 illustrates a block diagram of example, non-limiting abstraction model layers in accordance with one or more embodiments of the subject disclosure.

Referring now to FIG. 10, a set of functional abstraction layers provided by cloud computing environment 950 (FIG. 9) is shown. It should be understood in advance that the components, layers, and functions shown in FIG. 10 are intended to be illustrative only and embodiments of the invention are not limited thereto. As depicted, the following layers and corresponding functions are provided:

Hardware and software layer 1060 includes hardware and software components. Examples of hardware components include: mainframes 1061; RISC (Reduced Instruction Set Computer) architecture based servers 1062; servers 1063; blade servers 1064; storage devices 1065; and networks and networking components 1066. In some embodiments, software components include network application server software 1067, database software 1068, quantum platform routing software (not illustrated in FIG. 10), and/or quantum software (not illustrated in FIG. 10).

Virtualization layer 1070 provides an abstraction layer from which the following examples of virtual entities may be provided: virtual servers 1071; virtual storage 1072; virtual networks 1073, including virtual private networks; virtual applications and operating systems 1074; and virtual clients 1075.

In one example, management layer 1080 may provide the functions described below. Resource provisioning 1081 provides dynamic procurement of computing resources and other resources that are utilized to perform tasks within the cloud computing environment. Metering and Pricing 1082 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1083 provides access to the cloud computing environment for consumers and system administrators. Service level management 1084 provides cloud computing resource allocation and management such that required service levels are met. Service Level Agreement (SLA) planning and fulfillment 1085 provide pre-arrangement for, and procurement of, cloud computing resources for which a future requirement is anticipated in accordance with an SLA.

Workloads layer 1090 provides examples of functionality for which the cloud computing environment may be utilized. Non-limiting examples of workloads and functions which may be provided from this layer include: mapping and navigation 1091; software development and lifecycle management 1092; virtual classroom education delivery 1093; data analytics processing 1094; transaction processing 1095; and routine evaluation software 1096.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, and/or other program modules that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, handheld computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
    a memory that stores computer executable components; and
    at least one processor that executes at least one of the computer executable components that:
        executes in parallel, by the at least one processor, different compilers respectively using different quantum circuit optimization sequences on respective identical copies of an input raw quantum circuit to produce respective compiled output quantum circuits for execution on at least one quantum computer, wherein the different quantum circuit optimization sequences comprise respective groups of optimization routines, where the optimization routines of each respective group of optimization routine of an associated different quantum circuit optimization sequence are applied in a respective defined order of the associated different quantum circuit optimization sequence to an associated respective identical copy of the input raw quantum circuit to produce a respective compiled output quantum circuit, and wherein at least two of the different quantum circuit optimization sequences comprise a same group of optimization routines in different respective defined orders; and identifies, by the at least one processor, at least one of the different quantum circuit optimization sequences that generates a respective compiled output quantum circuit comprising defined criteria.

2. The system of claim 1, wherein the at least one of the computer executable components further:

selects, by the at least one processor, the different quantum circuit optimization sequences based on one or more properties of one or more quantum devices that have an ability to execute at least one of the input raw quantum circuit or the respective compiled output quantum circuit comprising the defined criteria.

3. The system of claim 2, wherein the selecting employs a machine learning model.

4. The system of claim 1, wherein the defined criteria are selected from a group consisting of a defined quantum circuit based metric and a defined pulse based metric.

5. The system of claim 1, wherein the at least one of the computer executable components further:

stores, by the at least one processor, in a knowledge base, multiple output quantum circuits generated from execution of the different quantum circuit optimization sequences on the respective identical copies of the input raw quantum circuit, and wherein the multiple output quantum circuits respectively comprise different defined criteria.

6. A computer-implemented method, comprising:

executing in parallel, by at least one processor of a system, different compilers respectively using different quantum circuit optimization sequences on respective identical copies of an input raw quantum circuit to produce respective compiled output quantum circuits for execution on at least one quantum computer, wherein the different quantum circuit optimization sequences comprise respective groups of optimization routines, where the optimization routines of each respective group of optimization routine of an associated different quantum circuit optimization sequence are applied in a respective defined order of the associated different quantum circuit optimization sequence to an associated respective identical copy of the input raw quantum circuit to produce a respective compiled output quantum circuit, and wherein at least two of the different quantum circuit optimization sequences comprise a same group of optimization routines in different respective defined orders; and identifying, by the at least one processor, at least one of the different quantum circuit optimization sequences that generates a respective compiled output quantum circuit comprising defined criteria.

7. The computer-implemented method of claim 6, further comprising:

selecting, by the at least one processor, the different quantum circuit optimization sequences based on one or more properties of one or more quantum devices that have an ability to execute at least one of the input raw quantum circuit or the respective compiled output quantum circuit comprising the defined criteria.

8. The computer-implemented method of claim 7, wherein the selecting employs a machine learning model.

9. The computer-implemented method of claim 6, wherein the defined criteria are selected from a group consisting of a defined quantum circuit based metric and a defined pulse based metric.

10. The computer-implemented method of claim 6, further comprising:

storing, by the at least one processor, in a knowledge base, multiple output quantum circuits generated from execution of the different quantum circuit optimization sequences on the respective identical copies of the input raw quantum circuit, wherein the multiple output quantum circuits respectively comprise different defined criteria.

11. A computer program product comprising a computer readable storage medium having program instructions embodied therewith, the program instructions executable by at least one processor to cause the at least one processor to:

execute in parallel, by the at least one processor, different compilers respectively using different quantum circuit optimization sequences on respective identical copies of an input raw quantum circuit to produce respective compiled output quantum circuits for execution on at least one quantum computer, wherein the different quantum circuit optimization sequences comprise respective groups of optimization routines, where the optimization routines of each respective group of optimization routine of an associated different quantum circuit optimization sequence are applied in a respective defined order of the associated different quantum circuit optimization sequence to an associated respective identical copy of the input raw quantum circuit to produce a respective compiled output quantum circuit, and wherein at least two of the different quantum circuit optimization sequences comprise a same group of optimization routines in different respective defined orders; and identify, by the at least one processor, at least one of the different quantum circuit optimization sequences that generates a respective compiled output quantum circuit comprising defined criteria.

12. The computer program product of claim 11, wherein the program instructions are further executable by the at least one processor to cause the at least one processor to:

select, by the at least one processor, the different quantum circuit optimization sequences based on one or more properties of one or more quantum devices that have an ability to execute at least one of the input raw quantum circuit or the respective compiled output quantum circuit comprising the defined criteria.

13. The computer program product of claim 12, wherein the selecting employs a machine learning model.

14. The computer program product of claim 11, wherein the defined criteria are selected from a group consisting of a defined quantum circuit based metric and a defined pulse based metric.

15. The computer program product of claim 11, wherein the program instructions are further executable by the at least one processor to cause the at least one processor to:

store, by the at least one processor, in a knowledge base, multiple output quantum circuits generated from execution of the different quantum circuit optimization sequences on the respective identical copies of the input raw quantum circuit, wherein the multiple output quantum circuits respectively comprise different defined criteria.

16. A system, comprising:

a memory that stores computer executable components; and at least one processor that executes at least one of the computer executable components that:

generates, by the at least one processor, a knowledge base comprising multiple groups of output quantum circuits, wherein each group is associated with a different input raw quantum circuit, and wherein the generating for each group, comprises:

executing in parallel, by the at least one processor, different compilers respectively using different quantum circuit optimization sequences on respective identical copies of an input raw quantum circuit of the different input raw quantum circuits to produce respective compiled output quantum circuits for execution on at least one quantum device, wherein the different quantum circuit optimization sequences comprise respective groups of optimization routines, where the optimization routines of each respective group of optimization routine of an associated different quantum circuit optimization sequence are applied in a respective defined order of the associated different quantum circuit optimization sequence to an associated respective identical copy of the input raw quantum circuit to produce a respective compiled output quantum circuit, and wherein at least two of the different quantum circuit optimization sequences comprise a same group of optimization routines in different respective defined orders; and generating, by the at least one processor, metrics associated with the execution of the different compilers respectively using the different quantum circuit optimization sequences on the input raw quantum circuit;

trains, by the at least one processor, using the knowledge base, a machine learning model to generate recommendations of quantum circuit optimization sequences to employ for compiling input quantum circuits into compiled output quantum circuits for execution on quantum devices; and receives, by the at least one processor, an input quantum circuit; and generates, by the at least one processor, using the machine learning model, a recommendation specifying a quantum circuit optimization sequence to employ for compiling the input quantum circuit into a compiled output quantum circuit for execution on a quantum device based on defined criteria associated with the metrics.

17. The system of claim 16, wherein the at least one of the computer executable components further:

selects, by the at least one processor, the different quantum circuit optimization sequences based on one or more properties of one or more quantum devices that have an ability to execute at least one of the input raw quantum circuit or the respective compiled output quantum circuit comprising the defined criteria.

18. The system of claim 16, wherein the metrics are selected from a group consisting of at least one defined quantum circuit based metric and at least one defined pulse based metric.

19. The system of claim 16, wherein the output quantum circuits in a group respectively comprise different defined criteria.

20. The system of claim 16, wherein the generating the recommendation comprises ranking the different quantum circuit optimization sequences based on defined entity criteria.

21. A computer-implemented method, comprising:

generating, by at least one processor of a system, a knowledge base comprising multiple groups of output quantum circuits, wherein each group is associated with a different input raw quantum circuit, and wherein the generating for each group, comprises:

executing in parallel, by the at least one processor, different compilers respectively using different quantum circuit optimization sequences on respective identical copies of an input raw quantum circuit of the different input raw quantum circuits to produce respective compiled output quantum circuits for execution on at least one quantum device, wherein the different quantum circuit optimization sequences comprise respective groups of optimization routines, where the optimization routines of each respective group of optimization routine of an associated different quantum circuit optimization sequence are applied in a respective defined order of the associated different quantum circuit optimization sequence to an associated respective identical copy of the input raw quantum circuit to produce a respective compiled output quantum circuit, and wherein at least two of the different quantum circuit optimization sequences comprise a same group of optimization routines in different respective defined orderers; and generating, by the at least one processor, metrics associated with the execution of the different compilers respectively using the different quantum circuit optimization sequences on the input raw quantum circuit;

training, by the at least one processor, using the knowledge base, a machine learning model to generate recommendations of quantum circuit optimization sequences to employ for compiling input quantum circuits into compiled output quantum circuits for execution on quantum devices; and receiving, by the at least one processor, an input quantum circuit; and generating, by the at least one processor, using the machine learning model, a recommendation specifying a quantum circuit optimization sequence to employ for compiling the input quantum circuit into a compiled output quantum circuit for execution on a quantum device based on defined criteria associated with the metrics.

22. The computer-implemented method of claim 21, further comprising:

selecting, by the at least one processor, the different quantum circuit optimization sequences based on one or more properties of one or more quantum devices that have an ability to execute at least one of the input raw quantum circuit or the respective compiled output quantum circuit comprising the defined criteria.

23. The computer-implemented method of claim 21, wherein the defined criteria are selected from a group consisting of at least one defined quantum circuit based metric and at least one defined pulse based metric.

24. The computer-implemented method of claim 21, wherein the output quantum circuits respectively comprise different defined criteria.

25. The computer-implemented method of claim 21 wherein the generating the recommendation comprises
ranking the different quantum circuit optimization sequences based on defined entity criteria.

* * * * *